US010062325B2

(12) United States Patent
Lee

(10) Patent No.: US 10,062,325 B2
(45) Date of Patent: Aug. 28, 2018

(54) PIXEL CIRCUIT AND ORGANIC LIGHT EMITTING DISPLAY DEVICE HAVING THE SAME

(71) Applicant: Samsung Display Co., Ltd., Yongin-si, Gyeonggi-do (KR)

(72) Inventor: Gil-Jae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 52 days.

(21) Appl. No.: 15/090,413

(22) Filed: Apr. 4, 2016

(65) Prior Publication Data
US 2017/0061877 A1 Mar. 2, 2017

(30) Foreign Application Priority Data
Aug. 24, 2015 (KR) .................. 10-2015-0118654

(51) Int. Cl.
*G09G 5/00* (2006.01)
*G09G 3/3233* (2016.01)
(Continued)

(52) U.S. Cl.
CPC ......... *G09G 3/3233* (2013.01); *G09G 3/2007* (2013.01); *G09G 3/3258* (2013.01); *H01L 27/3262* (2013.01); *H01L 27/3265* (2013.01); *H01L 27/3276* (2013.01); *G09G 2300/0426* (2013.01); *G09G 2300/0819* (2013.01); *G09G 2300/0866* (2013.01); *G09G 2310/0251* (2013.01); *G09G 2310/0262* (2013.01); *G09G 2320/0295* (2013.01);
(Continued)

(58) Field of Classification Search
CPC ..... G09G 2320/045; G09G 2320/0295; G09G 3/3291; G09G 2300/0819
See application file for complete search history.

(56) References Cited

U.S. PATENT DOCUMENTS

2006/0139253 A1* 6/2006 Choi .................... G09G 3/3233
345/76
2014/0176523 A1* 6/2014 Kwak .................. G09G 3/3233
345/212
(Continued)

FOREIGN PATENT DOCUMENTS

| KR | 10-2013-0055402 A | 5/2013 |
| KR | 10-2013-0074147 A | 7/2013 |
| KR | 10-2014-0133189 A | 11/2014 |

*Primary Examiner* — Mark Edwards
(74) *Attorney, Agent, or Firm* — Lewis Roca Rothenberg Christie LLP

(57) ABSTRACT

A pixel circuit according to example embodiments includes a scan switch connected between a data line and a first node, a storage capacitor, an organic light emitting diode, a driving transistor connected to a first power voltage and configured to generate a driving current, a first control switch connected between the driving transistor and a second node and configured to be turned on during a first sensing period based on a first control signal, a second control switch connected between the second node and an anode of the organic light emitting diode and configured to be turned on during a second sensing period based on a second control signal, and a sensing switch connected between the data line and the second node and configured to be turned on based on a sensing control signal.

12 Claims, 17 Drawing Sheets

(51) Int. Cl.
 *H01L 27/32* (2006.01)
 *G09G 3/20* (2006.01)
 *G09G 3/3258* (2016.01)

(52) U.S. Cl.
 CPC ............ *G09G 2320/045* (2013.01); *G09G 2320/0693* (2013.01); *G09G 2330/021* (2013.01); *G09G 2330/04* (2013.01)

(56) References Cited

U.S. PATENT DOCUMENTS

| | | | | |
|---|---|---|---|---|
| 2014/0347253 A1* | 11/2014 | Lee | ............... | H05B 33/0896 345/76 |
| 2014/0375533 A1* | 12/2014 | Kim | ............... | G09G 3/3233 345/78 |
| 2015/0179105 A1* | 6/2015 | Mizukoshi | ...... | G09G 3/3266 345/76 |
| 2016/0300534 A1* | 10/2016 | Kishi | ............... | G09G 3/3233 |
| 2017/0025061 A1* | 1/2017 | Takizawa | ........ | G09G 3/3233 |

\* cited by examiner

PIXEL CIRCUIT AND ORGANIC LIGHT EMITTING DISPLAY DEVICE HAVING THE SAME

CROSS REFERENCE TO RELATED APPLICATION

This application claims priority to and the benefit of Korean Patent Applications No. 10-2015-0118654, filed on Aug. 24, 2015 in the Korean Intellectual Property Office (KIPO), the disclosure of which is hereby incorporated by reference herein in its entirety.

BACKGROUND

1. Field

Example embodiments of the inventive concept relate to display devices and to organic light emitting display devices including organic light emitting diodes.

2. Description of the Related Art

An organic light emitting display device displays images using organic light emitting diodes. Because degradation of the organic light emitting diodes and a difference in the threshold voltage/mobility of a driving transistor may occur, luminance variations and image blur may be noticeable.

Typical organic light emitting display devices detect a pixel current and calculate a degradation of a pixel based on the detected pixel current. However, typical pixel structures and control signals cannot perform real time pixel current sensing operations, i.e., cannot detect a current of the driving transistor and a current of the organic light emitting diode, while displaying images.

SUMMARY

Example embodiments provide a pixel circuit capable of sensing characteristics of a driving transistor and degradation of an organic light emitting diode in real time.

Example embodiments provide an organic light emitting display device having the pixel circuit.

According to example embodiments, a display device may include a scan switch connected between a data line and a first node and configured to transmit a reference voltage corresponding to a gray level to the first node based on a scan signal, a storage capacitor connected between the first node and a first power voltage, an organic light emitting diode connected between a second node and a second power voltage, the first power voltage being greater than the second power voltage, a driving transistor connected to the first power voltage and configured to generate a driving current corresponding to a charged voltage at the storage capacitor, a first control switch connected between the driving transistor and the second node and configured to be turned on during a first sensing period based on a first control signal, a second control switch connected between the second node and an anode of the organic light emitting diode and configured to be turned on during a second sensing period based on a second control signal, and a sensing switch connected between the data line and the second node and configured to be turned on based on a sensing control signal.

In example embodiments, the first sensing period may be at least a part of a vertical blank period between a previous frame and a present frame.

In example embodiments, the second sensing period may be at least a part of a vertical blank period between a previous frame and a present frame.

In example embodiments, the first sensing period may include a data writing period and a first current sensing period.

In example embodiments, the first control signal may have a logical low level during the first sensing period to turn on the first control switch such that characteristics of the driving transistor may be detected.

In example embodiments, the scan signal may have the logical low level to turn on the scan switch during the data writing period such that the reference voltage may be applied to the first node.

In example embodiments, the second control signal may have the logical low level to turn on the second control switch during the data writing period such that the organic light emitting diode may emit light.

In example embodiments, the sensing control signal may have the logical low level to turn on the sensing switch and the second control signal has a logical high level to turn off the second control switch during the first current sensing period such that a sensing current corresponding to the driving current may not flow into the organic light emitting diode.

In example embodiments, the data line may provide the sensing current to an external sensing circuit in the first current sensing period to detect characteristics of the driving transistor.

In example embodiments, the first sensing period may further include a voltage adjusting period between the data writing period and the first current sensing period.

In example embodiments, the pixel may further include a power supply for adjusting the first power voltage to be substantially the same as the second power voltage during the voltage adjusting period. The scan signal, the sensing control signal, and the second control signal may have a logical high level during the voltage adjusting period.

In example embodiments, the second sensing period may include a data writing period and a second current sensing period.

In example embodiments, the second control signal may have a logical low level during the second sensing period to turn on the second control switch.

In example embodiments, the scan signal and the first control signal may have the logical low level during the data writing period to turn on the scan switch and the first control switch such that the driving current may flow into the organic light emitting diode.

In example embodiments, the sensing control signal may have the logical low level to turn on the sensing switch and the first control signal has a logical high level to turn off the first control switch during the second current sensing period such that a sensing current corresponding to the driving current may be provided to an external sensing circuit through the data line during the second current sensing period to detect characteristics of the organic light emitting diode.

In example embodiments, the pixel may further include a power supply for adjusting the first power voltage to be substantially the same as the second power voltage during a voltage adjusting period, the second sensing period may further include the voltage adjusting period between the data writing period and the first current sensing period. The scan signal, the sensing control signal, and the first control signal may have the logical high level during the voltage adjusting period.

According to example embodiments, an organic light emitting display device may include a display panel including a plurality of pixels each connected to a respective scan line of a plurality of scan lines, a respective data line of a plurality of data lines, a respective first control line of a plurality of first control lines, a respective second control line of a plurality of second control lines, and a respective sensing control line of a plurality of sensing control lines, a scan driver configured to provide scan signals to the scan lines, a data driver configured to provide data signals corresponding to an image to the data lines in an image display period and to provide reference voltages corresponding to gray levels to the data lines in a first sensing period and a second sensing period, a control line driver configured to provide first control signals, second control signals, and sensing control signals to the first control lines, the second control lines, and the sensing control lines, respectively, a sensing circuit configured to read first sensing currents and second sensing currents and to generate sensing data based on the first sensing currents and the second sensing currents, a power supply configured to provide a first power voltage and a second power voltage less than the first power voltage to the display panel, and a controller configured to generate compensated image data based on the sensing data. Each of the pixels may include a scan switch connected between the respective data line and a first node and configured to transmit a respective reference voltage of the reference voltages to the first node based on a respective scan signal of the scan signals, an organic light emitting diode connected between a second node and the second power voltage, a storage capacitor connected between the first node and the first power voltage, a driving transistor connected to the first power voltage and configured to generate a driving current corresponding to a charged voltage at the storage capacitor, a first control switch connected between the driving transistor and the second node and configured to be turned on during the first sensing period based on a respective first control signal of the first control signals, a second control switch connected between the second node and an anode of the organic light emitting diode and configured to be turned on during the second sensing period based on a respective second control signal of the second control signals, and a sensing switch connected between the data line and the second node and configured to be turned on based on a respective sensing control signal of the sensing control signals.

In example embodiments, the first sensing period may be at least a part of a first vertical blank period and the second sensing period may be at least a part of a second vertical blank period.

In example embodiments, the sensing circuit may be configured to read the first sensing currents, which flow through the driving transistors, from the data lines during the first sensing period. The sensing circuit may be configured to read the second sensing currents, which flow into the organic fight emitting diodes, from the data lines during the second sensing period.

In example embodiments, the data driver may be configured to generate the data signals and the reference voltages based on the compensated image data.

Therefore, the pixel circuit according to example embodiments can perform a real time pixel current sensing operation while displaying images by switching the first control switch, the second control switch, and the sensing switch. Thus, a sensing time for compensating the image data may be reduced and display quality may be maintained by sensing and compensating.

In addition, the organic light emitting display device may include pixels that operate in the first and second sensing periods between image display periods such that the organic light emitting display device may read the pixel currents in real time. Thus, the degradation of the organic light emitting diode and variation of the threshold voltage/mobility of the driving transistor may be detected and compensated in real time while displaying images. Therefore, a sensing time for compensating the image data may be reduced and display quality may be maintained by sensing and compensating.

BRIEF DESCRIPTION OF THE DRAWINGS

Example embodiments can be understood in more detail from the following description taken in conjunction with the accompanying drawings, in which.

DETAILED DESCRIPTION

Figure 1:
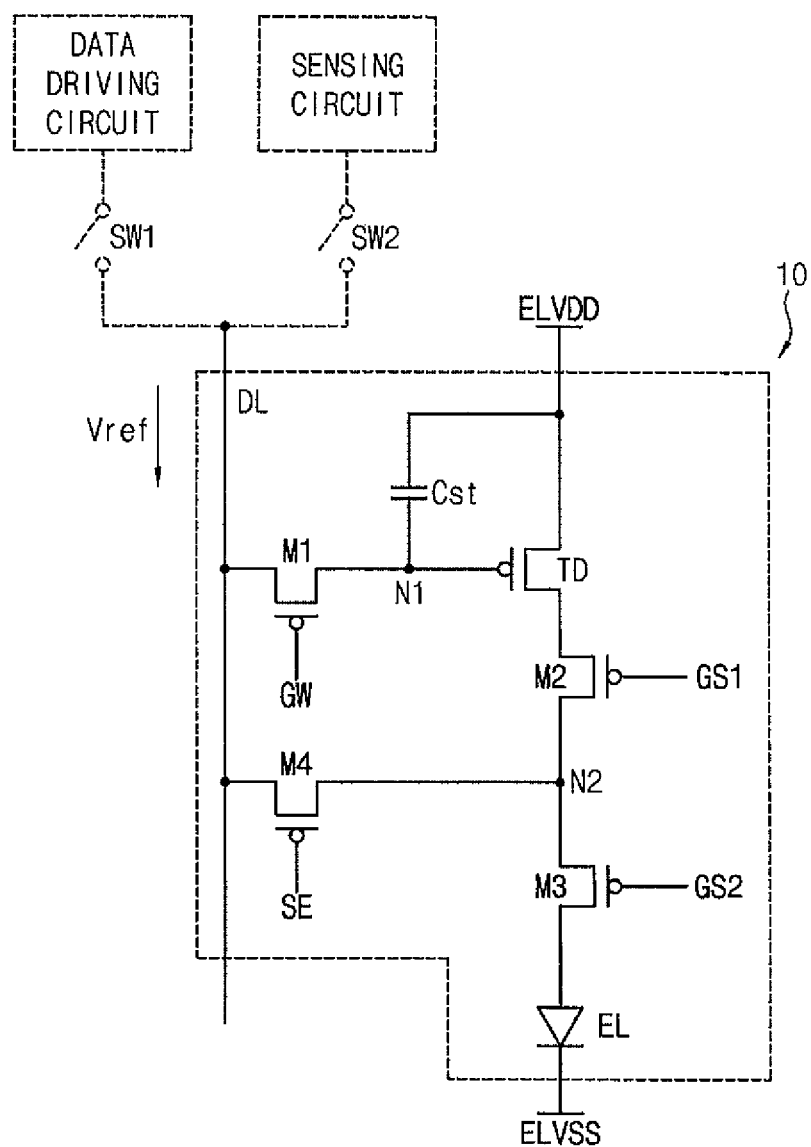
FIG. 1 is a circuit diagram of a pixel circuit according to example embodiments.

Exemplary embodiments will be described more fully hereinafter with reference to the accompanying drawings, in which various embodiments are shown.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

A relevant device or component (or relevant devices or components) according to embodiments of the present invention described herein may be implemented utilizing any suitable hardware, firmware (e.g. an application-specific integrated circuit), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

FIG. 1 is a circuit diagram of a pixel circuit according to example embodiments.

Referring to FIG. 1 the pixel circuit 10 may include an organic light emitting diode EL, a scan switch M1, a storage capacitor Cst, a driving transistor TD, a first control switch M2, a second control switch M3, and a sensing switch M4. The pixel circuit 10 may be included in a display panel of an organic light emitting display device.

In some embodiments, the scan switch M1, the driving transistor TD, the first control switch M2, the second control switch M3, and the sensing switch M4 may be p-channel metal-oxide semiconductor (PMOS) transistors or n-channel metal-oxide semiconductor (NMOS) transistors. Hereinafter, operations of the pixel circuit 10 and the organic light emitting display device will be explained with the pixel circuit 10 and the organic light emitting display device including PMOS transistors. The PMOS or NMOS transistors may be formed by oxide thin film transistors (TFT), Amorphous-silicon TFTs, or Poly-silicon TFTs.

In some embodiments, the pixel circuit 10 may operate in an image display period and a sensing period. In the image display period, a data voltage corresponding to an image may be provided to the pixel circuit through a data line DL. In the sensing period, a reference voltage Vref corresponding to a gray level (e.g., a predetermined gray level) may be provided to the pixel circuit 10 through the data line DL. A current of the driving transistor TD or a current of the organic light emitting diode EL may be detected in the sensing period.

Figure 2:
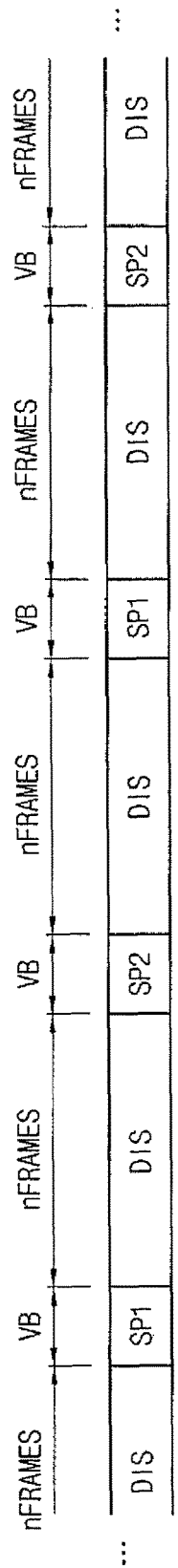
FIG. 2 is a diagram illustrating an example of an operation of the pixel circuit of FIG. 1.

Referring to FIG. 2, in some embodiments, the sensing period may include a first sensing period SP1 for detecting (or sensing) a first sensing current I1 from the driving transistor TD and a second sensing period SP2 for detecting (or sensing) a second sensing current I2 from the organic light emitting diode EL.

In some embodiments, the first sensing period SP1 may be at least a part of a vertical blank period between a previous frame and a present frame. In some embodiments, the second sensing period SP2 is at least a part of a vertical blank period between a previous frame and a present frame. For example, the first and second sensing periods SP1 and SP2 may be included in different vertical blank period from each other, or may be included in the same vertical blank period without overlapping each other.

Referring back to FIG. 1, the scan switch M1 may be connected between the data line DL and a first node N1. The scan switch M1 may transmit the data voltage or the reference voltage Vref corresponding to the gray level (e.g., a predetermined gray level) to the first node N1 based on a scan signal GW. In some embodiments, the scan switch M1 may include a first electrode connected to the data line DL, a second electrode connected to the first node N1, and a gate electrode to which the scan signal GW is applied.

The data line DL may transmit a data signal for displaying an image to the pixel circuit 10 in the image display period. The data line DL may transmit the reference voltage Vref to the pixel circuit 10 in the sensing period. The sensing current (e.g., the first sensing current I1 or second sensing current I2) (e.g., see FIG. 4C) generated at the pixel circuit 10 may be transmitted to an external sensing circuit through the data line DL.

The storage capacitor Cst may be connected between the first node N1 and a first power voltage ELVDD. The storage capacitor Cst may be charged with the data voltage or the reference voltage Vref from the data line DL when the scan switch M1 is turned on.

The driving transistor TD may be connected to the first power voltage ELVDD. The driving transistor TD may generate a driving current corresponding to a charged voltage at the storage capacitor Cst. In some embodiments, the driving transistor TD may include a first electrode connected to the first power voltage ELVDD, a second electrode connected to the first control switch M2, and a gate electrode connected to the first node N1. The driving current may correspond to a current for emitting the organic light emitting diode EL or the first sensing current I1.

The first control switch M2 may be connected between the driving transistor TD and a second node N2. The first control switch M2 may be turned on during the first sensing period SP1 based on a first control signal GS1. A threshold voltage and/or a mobility of the driving transistor TD may be detected and compensated using the first sensing current I1 in the first sensing period SP1. In some embodiments, the first control switch M2 may include a first electrode connected to the second electrode of the driving transistor TD, a second electrode connected to the second node N2, and a gate electrode to which the first control signal GS1 is applied. In some embodiments, the second control switch M3 may have a turn-off state during the first sensing period SP1.

The second control switch M3 may be connected between the second node N2 and an anode of the organic light emitting diode EL. The second control switch M3 may be turned on during the second sensing period SP2 based on a second control signal GS2. In some embodiments, the second control switch M3 may include a first electrode connected to the second node N2, a second electrode connected to the anode of the organic light emitting diode EL, and a gate electrode to which the second control signal GS2 is applied.

The sensing switch M4 may be connected between the data line DL and the second node N2. The sensing switch M4 may be turned on based on a sensing control signal SE. In some embodiments, the sensing switch M4 may include a first electrode connected to the data line DL, a second electrode connected to the second node N2, and a gate electrode to which the sensing control signal SE is applied. The sensing switch M4 may be turned on only in the sensing period.

The first sensing current I1 or the second sensing current I2 may flow through the data line DL when the sensing switch M4 is turned on. For example, the first sensing current I1 may be provided to the sensing circuit when the sensing switch M4 and the first control switch M2 are turned on, and the second sensing current I2 may be provided to the sensing circuit when the sensing switch M4 and the second control switch M3 are turned on.

Accordingly, the pixel circuit 10 may perform a real time pixel current sensing operation during operation of the organic light emitting display device by switching the first control switch M2, the second control switch M3, and the sensing switch M4. Thus, a sensing time for compensating the image data may be reduced and display quality may be maintained by sensing and compensating.

FIG. 2 is a diagram illustrating an example of an operation of the pixel circuit of FIG. 1.

Referring to FIGS. 1 and 2, the pixel circuit 10 and an organic light emitting display device having the same may operate in an image display period and a sensing period. The image display period may include an image display period DIS for displaying images. The sensing period may include a first sensing period SP1 and a second sensing period SP2 for sensing a current at the pixel circuit 10.

The image display period DIS may include consecutive frames nFRAMES. During the image display period DIS, data signals corresponding to the images may be applied to the data line DL such that the organic light emitting diode EL may emit light corresponding to the data signals.

Generally, a vertical blank period VB may exist between each adjacent pair of the frames. The vertical blank period VB may be a delay period after a previous frame and before start of a present frame.

The vertical blank periods VB may be between each adjacent pair of the frames nFRAMES in the image display period DIS.

The first sensing period SP1 and the second sensing period SP2 may be between the image display periods DIS, respectively. In some embodiments, the first sensing period SP1 may be at least a part of the vertical blank period VB. However, the first sensing period SP1 may not be included in every vertical blank period VB. Similarly, the second sensing period SP2 may be at least a part of the vertical blank period VB. However, the first sensing period SP1 may not be included in every vertical blank period VB.

A first sensing current I1 that is a current of the driving transistor TD may be detected in the first sensing period SP1. Thus, characteristics of a threshold voltage and mobility of the driving transistor TD may be detected (or be sensed) in the first sensing period SP1. Further, the external sensing circuit may compensate the data signals based on the first sensing current I1. In some embodiments, the first sensing period SP1 may be set periodically. For example, as illustrated in FIG. 2, the first sensing period SP1 may be set in every 2n frames such that the first sensing current I1 may be detected every 2n frames. For example, the first sensing current I1 may be detected at about 5 minute intervals while displaying images. However, these are examples and periods (or intervals) of the first sensing period SP1 are not limited thereto. For example, the first sensing period SP1 may be set non-periodically.

A second sensing current I2 that is a current of the organic light emitting diode EL may be detected in the second sensing period SP2. Thus, degradation of the organic light emitting diode EL may be detected (or be sensed) in the second sensing period SP2. Further, the external sensing circuit may compensate the data signals based on the second sensing current I2. In some embodiments, the second sensing period SP2 may be set periodically. For example, as illustrated in FIG. 2, the second sensing period SP2 may be set in every 2n frames such that the second sensing current I2 may be detected every 2n frames. For example, the second sensing current I2 may be detected at about 5 minute intervals while displaying images. However, these are examples and periods (or intervals) of the first sensing period SP1 are not limited thereto. For example, the first sensing period SP1 may be set non-periodically.

In some embodiments, an interval of the first sensing period SP1 may be different from an interval of the second sensing period SP2. In some embodiments, the first sensing period SP1 and the second sensing period SP2 may be included in a single vertical blank period VB successively.

The first sensing period SP1 and the second sensing period SP2 may be set by a command from a user.

Accordingly, the first and second currents may be detected in real time while displaying images.

Hereinafter, operation of the pixel circuit 10 sinking the first and/or second sensing currents I1 and I2 will be described in detail with reference to FIGS. 3 through 10.

Figure 3:
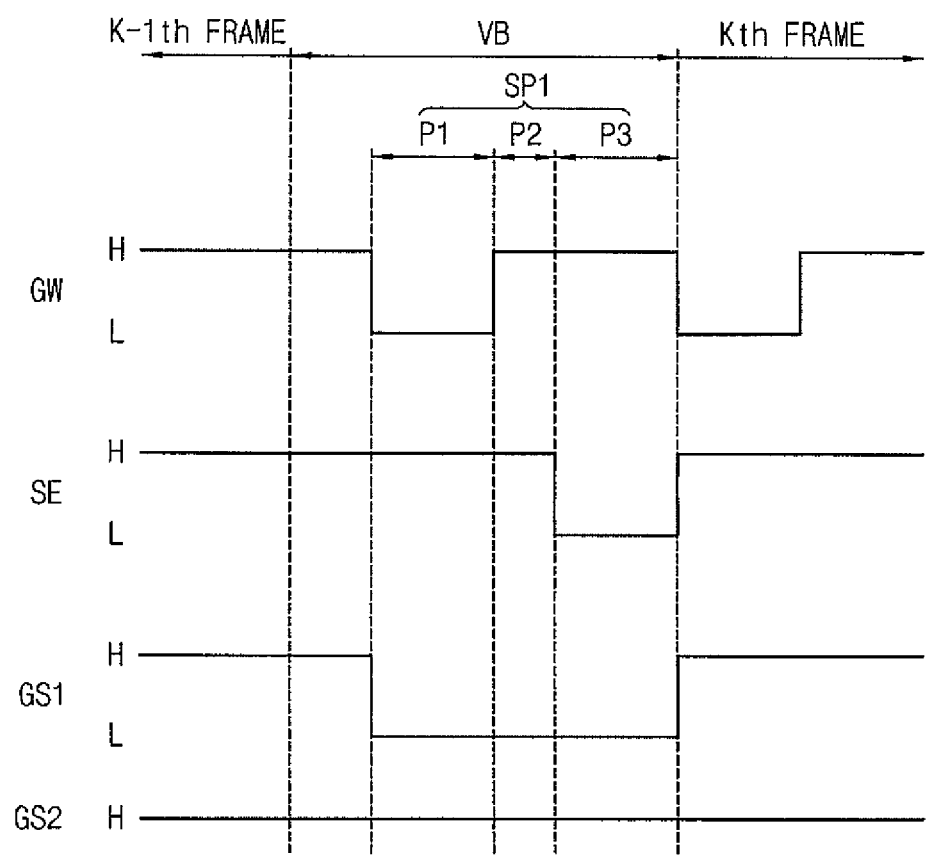
FIG. 3 is a timing diagram illustrating an example of signals provided to the pixel circuit of FIG. 1.
Figure 4A:
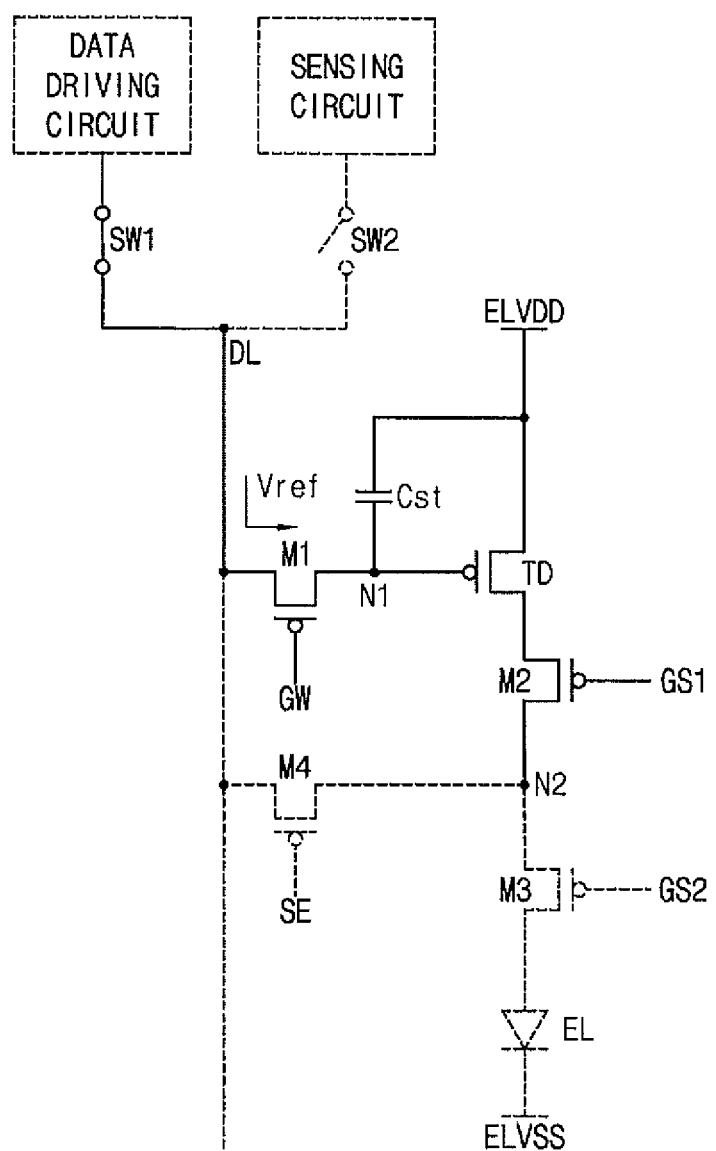
FIGS. 4A through 4C are diagrams illustrating an example of an operation of the pixel circuit based on the signals of FIG. 3.
Figure 4B:
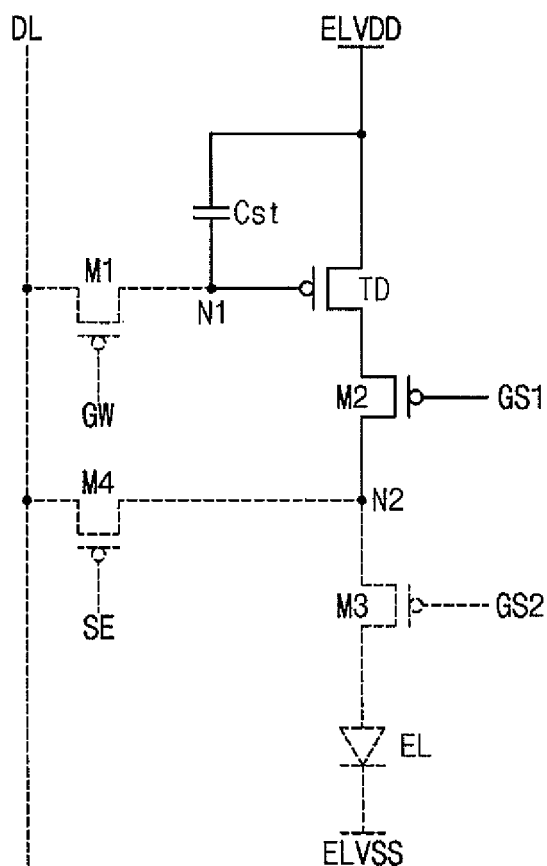
Figure 4C:
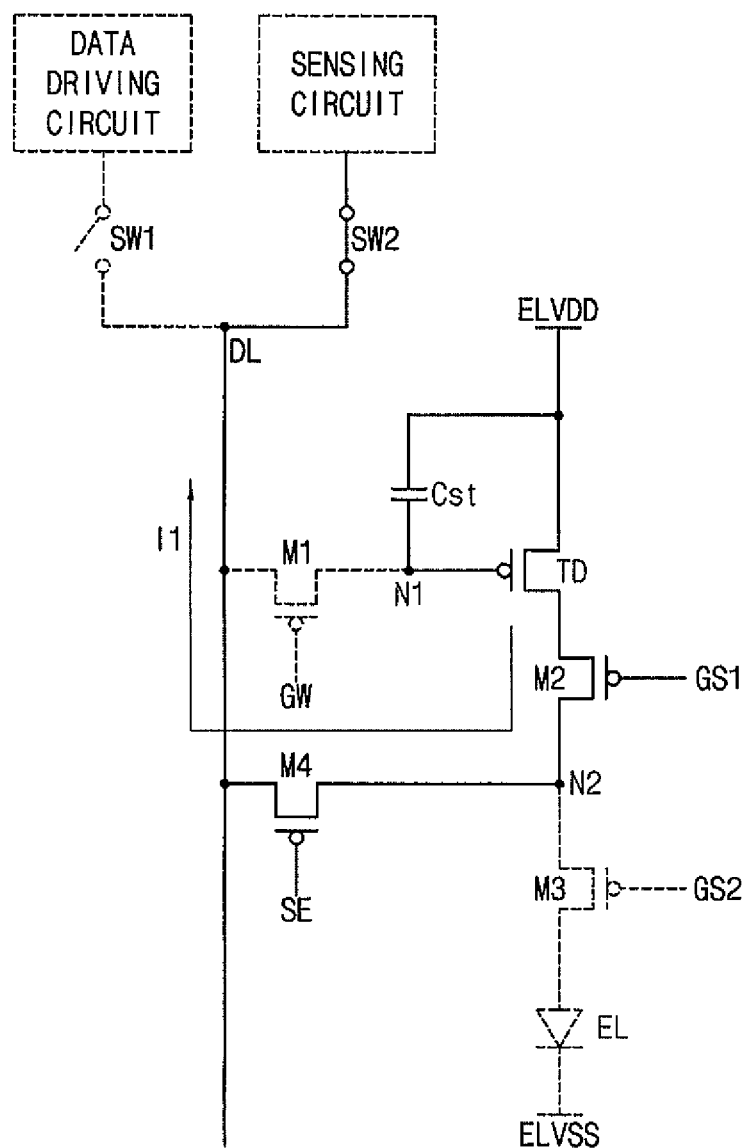
Figure 5:
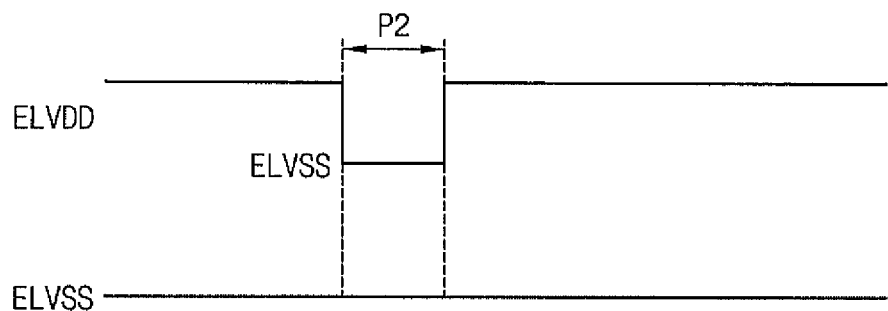
FIG. 5 is a timing diagram illustrating an example of power voltages provided to the pixel circuit according to the timing diagram of FIG. 3.

FIG. 3 is a timing diagram illustrating an example of signals provided to the pixel circuit of FIG. 1. FIGS. 4A through 4C are diagrams illustrating an example of an operation of the pixel circuit based on the signals of FIG. 3. FIG. 5 is a timing diagram illustrating an example of power voltages provided to the pixel circuit of FIG. 3.

Referring to FIGS. 1 and 3 through 5, the pixel circuit 10 may output a first sensing current I1 to an external sensing circuit in a first sensing period SP1.

In some embodiments, the first sensing period SP1 may be included in at least a part of a vertical blank period VB between a previous frame and a present frame. The first sensing period SP1 may include a data writing period P1 and a first current sensing period P3. The first sensing period SP1 may further include a voltage adjusting period P2 between the data writing period P1 and the first current sensing period P3 to lower a first power voltage ELVDD.

The first control signal GS1 may have a logical low level L during the first sensing period SP1 to turn on the first control switch M2 such that characteristics of the driving transistor TD is detected. Thus, the first control switch M2 may maintain a turn on state during the first sensing period SP1. In some embodiments, the second control signal GS2 may have a logic high level H during the first sensing period SP1. Thus, the second control switch M3 may maintain a turn off state during the first sensing period SP1.

In some embodiments, the data line DL may include a first switch SW1 connected to an external data driving circuit and a second switch SW2 connected to an external sensing circuit. When the data signal or the reference voltage Vref is applied to the display panel, the first switch SW1 may be turned on and the second switch SW2 may be turned off. For example, the first switch SW1 may be turned on and the second switch SW2 may be turned off in the data writing period P1. When the first sensing current I1 is provided to the sensing circuit, the first switch SW1 may be turned off and the second switch SW2 may be turned on.

The scan signal GW may have the logical low level L during the data writing period P1. Thus, as illustrated in FIG. 3A, the scan switch M1 may be turned on such that the reference voltage Vref may be applied to the first node N1. Thus, a voltage difference between the first power voltage ELVDD and the reference voltage Vref may be charged to the storage capacitor Cst.

In some embodiments, the reference voltage Vref may be applied to the first node N1 through the data line DL. Thus, an additional feedback line for sensing pixel currents is not used. Here, the sensing control signal SE and the second control signal GS2 may have the logical high level H. The reference voltage Vref may correspond to a specific gray level. For example, the reference voltage Vref may be set corresponding to a data voltage of gray level 64.

The scan signal GW, the sensing control signal SE, and the second control signal GS2 may have the logical high level H during the voltage adjusting period P2. As illustrated in FIG. 4B, only the first control switch M2 may maintain the turn on state in the voltage adjusting period P2. In some embodiments, the first power voltage ELVDD may be lowered in the voltage adjusting period P2 to prevent or reduce current leakage and emission of the organic light emitting diode EL. For example, as illustrated in FIG. 5, the first power voltage ELVDD may be adjusted to be substantially the same as the second power voltage ELVSS during the voltage adjusting period P2. However, this is an example and a voltage level of the first power voltage ELVDD in the voltage adjusting period P2 is not limited thereto. In some embodiments, the voltage adjusting period P2 may be omitted and the first sensing current I1 may be provided to the sensing circuit right after the data writing period P1.

The sensing control signal SE may have the logical low level L during the first current sensing period P3. The second control signal GS2 may have the logical high level H during the first current sensing period P3. Thus, as illustrated in FIG. 4C, the sensing switch M4 may be turned on. The first sensing current I1 flowing through the driving transistor TD may be output to the sensing circuit through the data line DL by the sensing switch M4 in the first current sensing period P3. The sensing circuit may read the first sensing current I1. Accordingly, degradation of the driving transistor TD, change of the threshold voltage of the driving transistor TD, change of the mobility of the driving transistor TD, etc. may be detected. For example, the first sensing current I1 generated by the reference voltage Vref corresponding to gray level 64 may be compared with a reference value corresponding to the gray level 64 at the sensing circuit.

The first control signal GS1, the second control signal GS2, and the sensing control signal SE may have the logical high level H in a next frame (i.e., a Kth FRAME). The scan signal GW may have the logical low level L in the next frame such that a data voltage corresponding to an image may be applied to the pixel circuit 10 through the scan switch M1.

As described above, degradation of the driving transistor TD, change of the threshold voltage of the driving transistor TD, and change of the mobility of the driving transistor TD may be detected and compensated in real time while displaying images by controlling the first control switch M2, the second control switch M3, and the sensing control switch M4.

Figure 6:
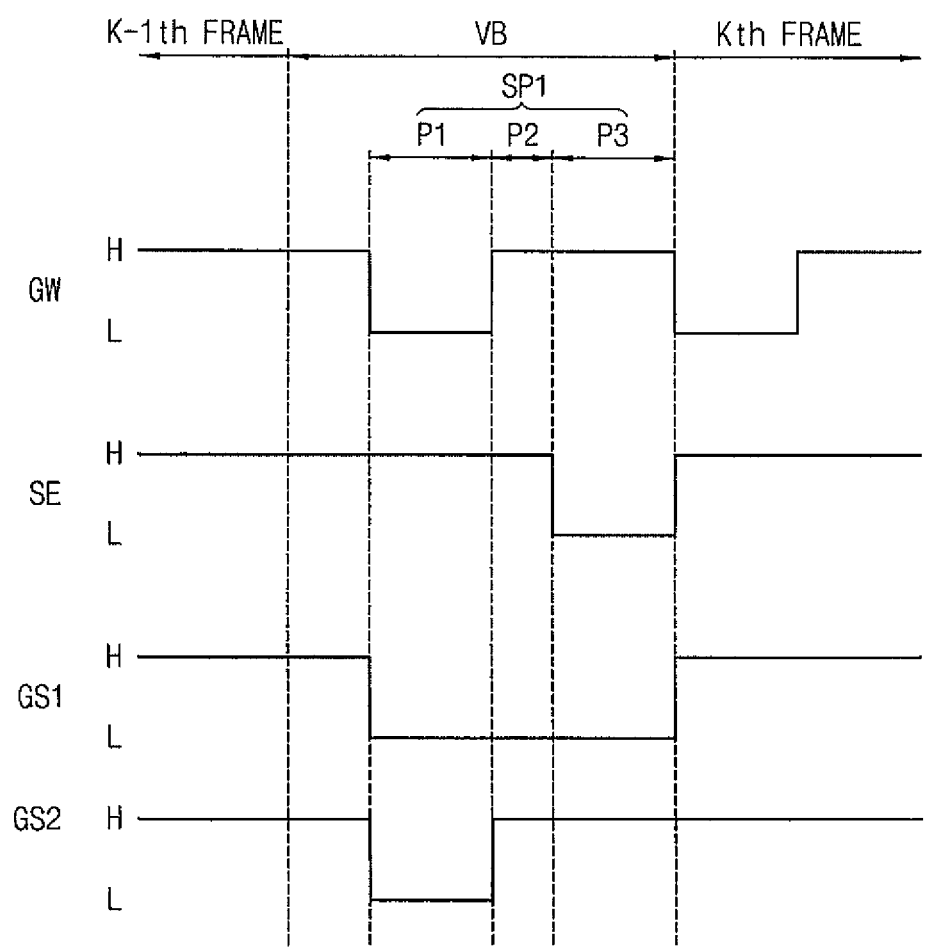
FIG. 6 is a timing diagram illustrating another example of signals provided to the pixel circuit of FIG. 1.
Figure 7A:
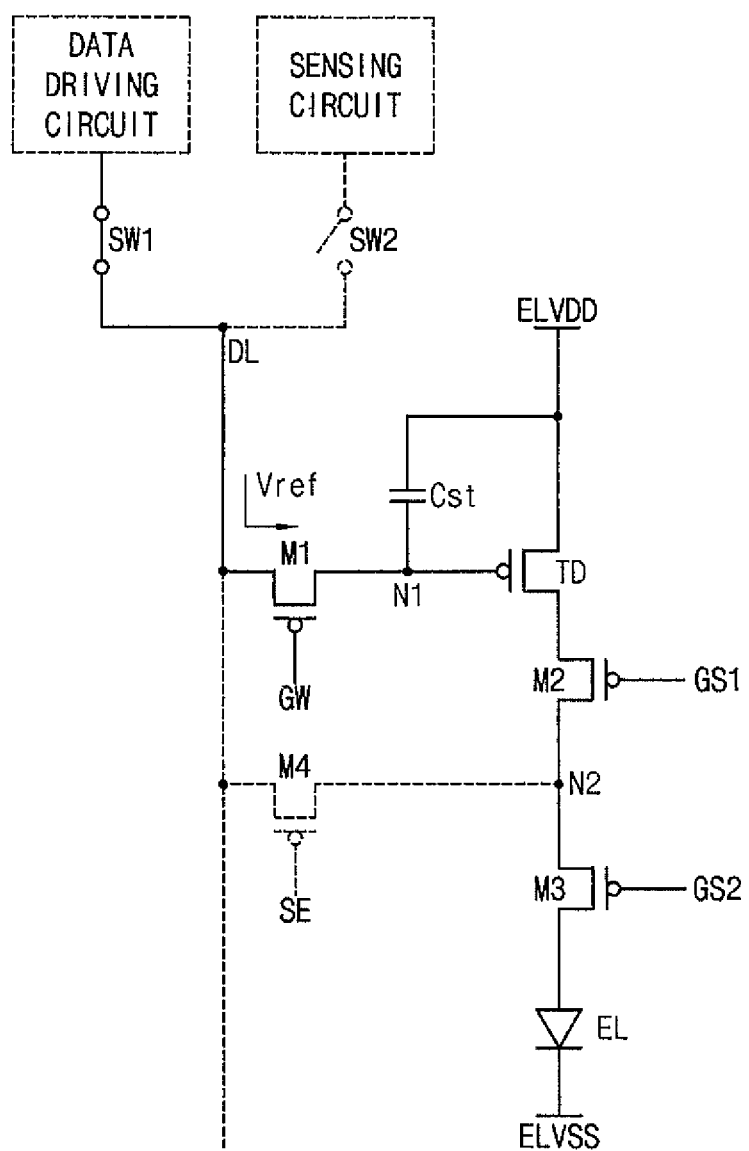
FIGS. 7A through 7C are diagrams illustrating an example of an operation of the pixel circuit based on the signals of FIG. 6.
Figure 7B:
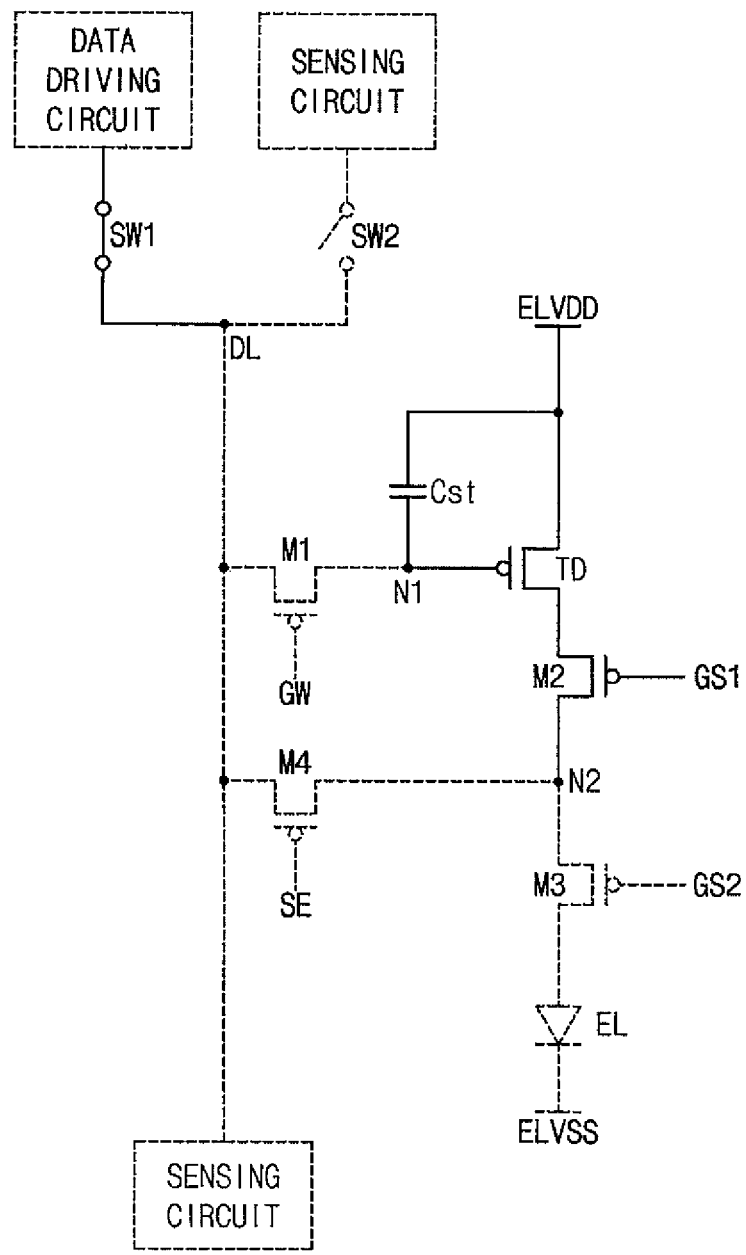
Figure 7C:
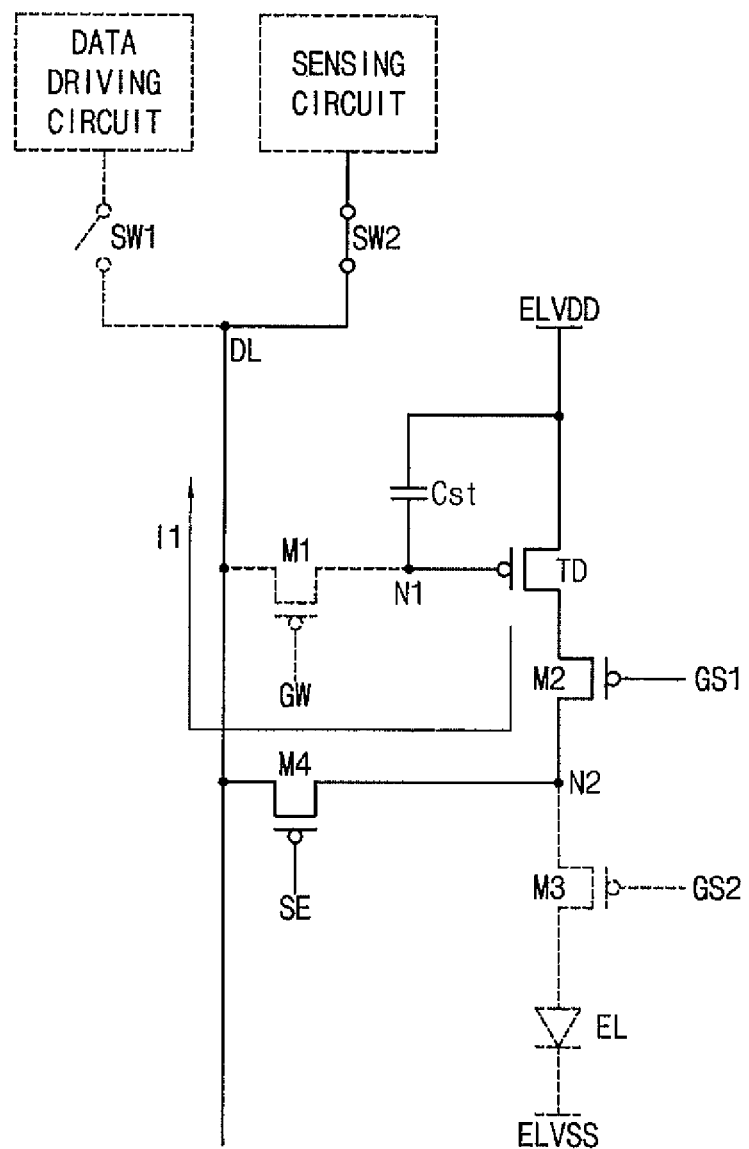

FIG. 6 is a timing diagram illustrating another example of signals provided to the pixel circuit of FIG. 1. FIGS. 7A through 7C are diagrams illustrating an example of an operation of the pixel circuit based on the signals of FIG. 6.

In FIGS. 6 through 7C, like reference numerals are used to designate elements (or components) that are the same or substantially the same as those in FIGS. 1 through 5, and detailed description of these elements (or components) may be omitted.

Referring to FIGS. 1 and 6 through 7C, the pixel circuit 10 may output a first sensing current I1 to an external sensing circuit in a first sensing period SP1.

In some embodiments, the first sensing period SP1 may be included in at least a part of a vertical blank period VB between a previous frame and a present frame. The first sensing period SP1 may include a data writing period P1, a voltage adjusting period P2, and a first current sensing period P3.

The first control signal GS1 may have a logical low level L during the first sensing period SP1 to turn on the first control switch M2 such that characteristics of the driving transistor TD is detected. Thus, the first control switch M2 may maintain a turn on state during the first sensing period SP1.

The scan signal GW and the second control signal GS2 may have the logical low level L during the data writing period P1. Thus, as illustrated in FIG. 7A, the scan switch M1 may be turned on such that the reference voltage Vref may be applied to the first node N1. Thus, a voltage difference between the first power voltage ELVDD and the reference voltage Vref may be charged to the storage capacitor Cst. In addition, the organic light emitting diode EL may emit light based on the charged voltage at the storage capacitor Cst.

The scan signal GW, the sensing control signal SE, and the second control signal GS2 may have the logical high level H during the voltage adjusting period P2. As illustrated in FIG. 7B, only the first control switch M2 of the pixel circuit 10 may maintain the turn on state in the voltage adjusting period P2. In some embodiments, the first power voltage ELVDD may be adjusted to be substantially the same as the second power voltage ELVSS during the voltage adjusting period P2. In some embodiments, the voltage adjusting period P2 may be omitted and the first sensing current I1 may be provided to the sensing circuit right after the data writing period P1.

The sensing control signal SE may have the logical low level L during the first current sensing period P3. The second control signal GS2 may have the logical high level H during the first current sensing period P3. Thus, as illustrated in FIG. 7C, the sensing switch M4 may be turned on. The first sensing current I1 flowing through the driving transistor TD may be output to the sensing circuit through the data line DL by the sensing switch M4 in the first current sensing period P3.

Figure 8:
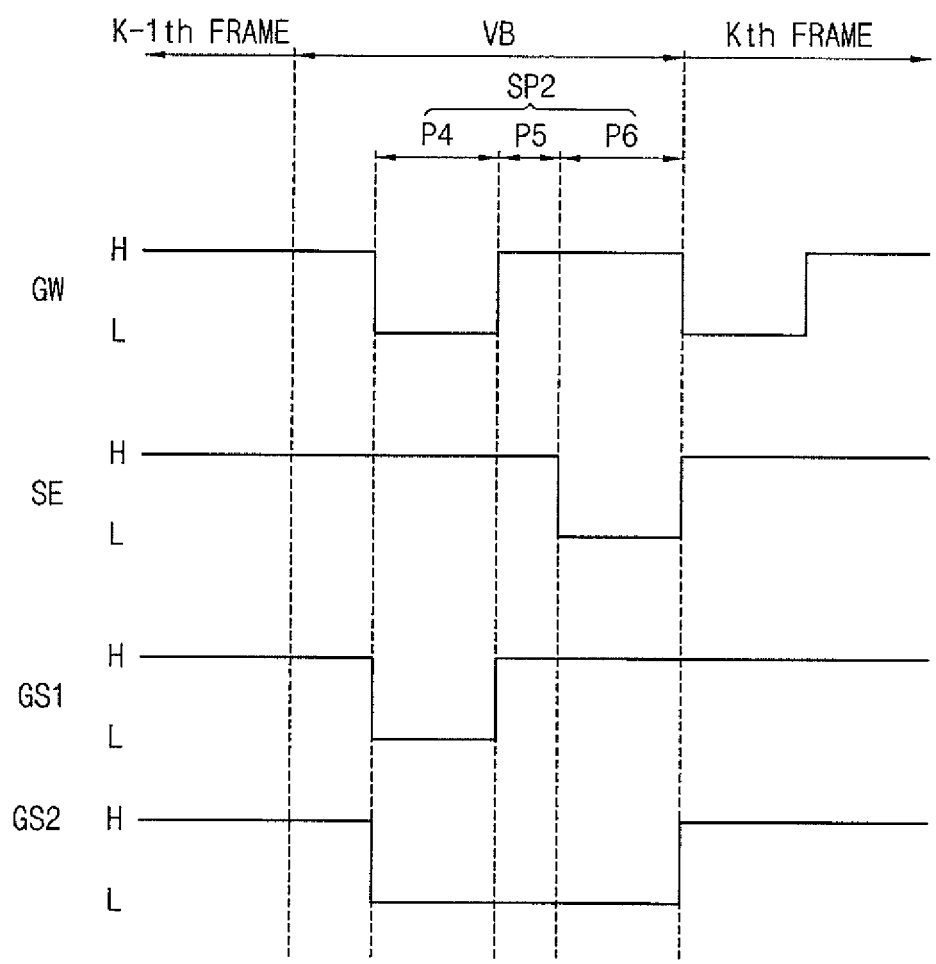
FIG. 8 is a timing diagram illustrating still another example of signals provided to the pixel circuit FIG. 1.
Figure 9A:
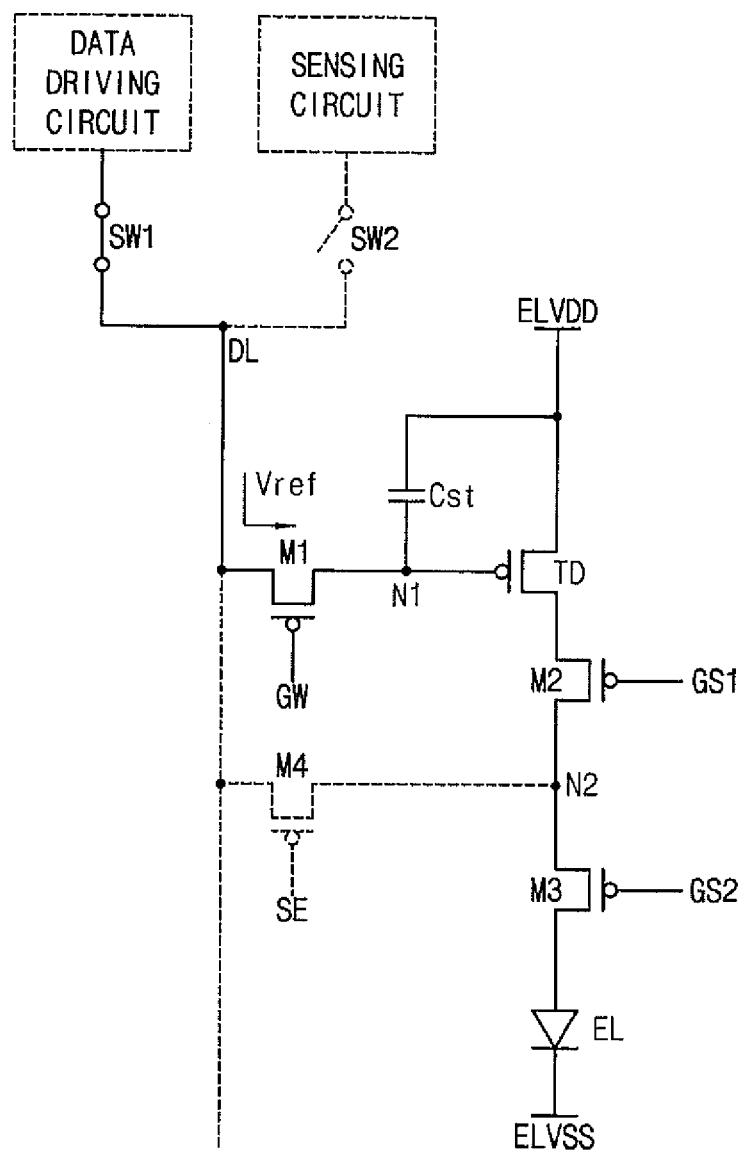
FIGS. 9A through 9C are diagrams illustrating an example of an operation of the pixel circuit based on the signals of FIG. 8.
Figure 9B:
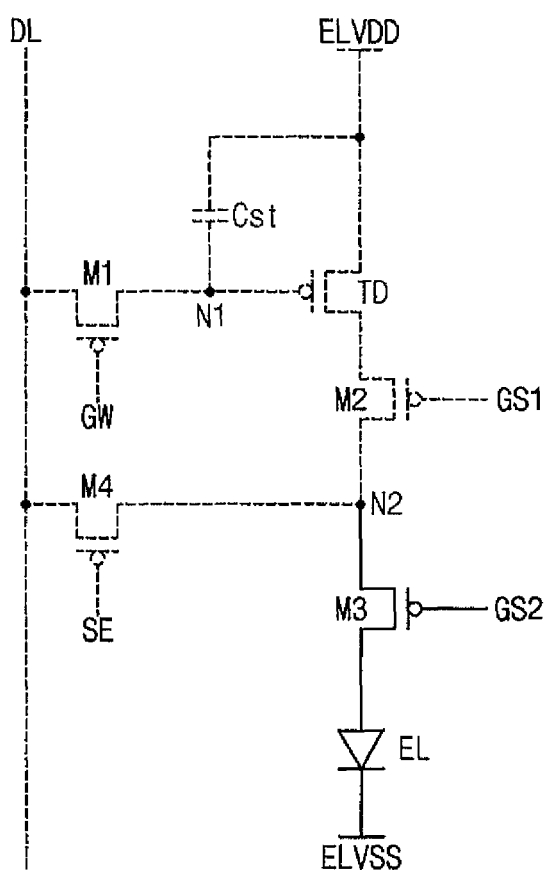
Figure 9C:
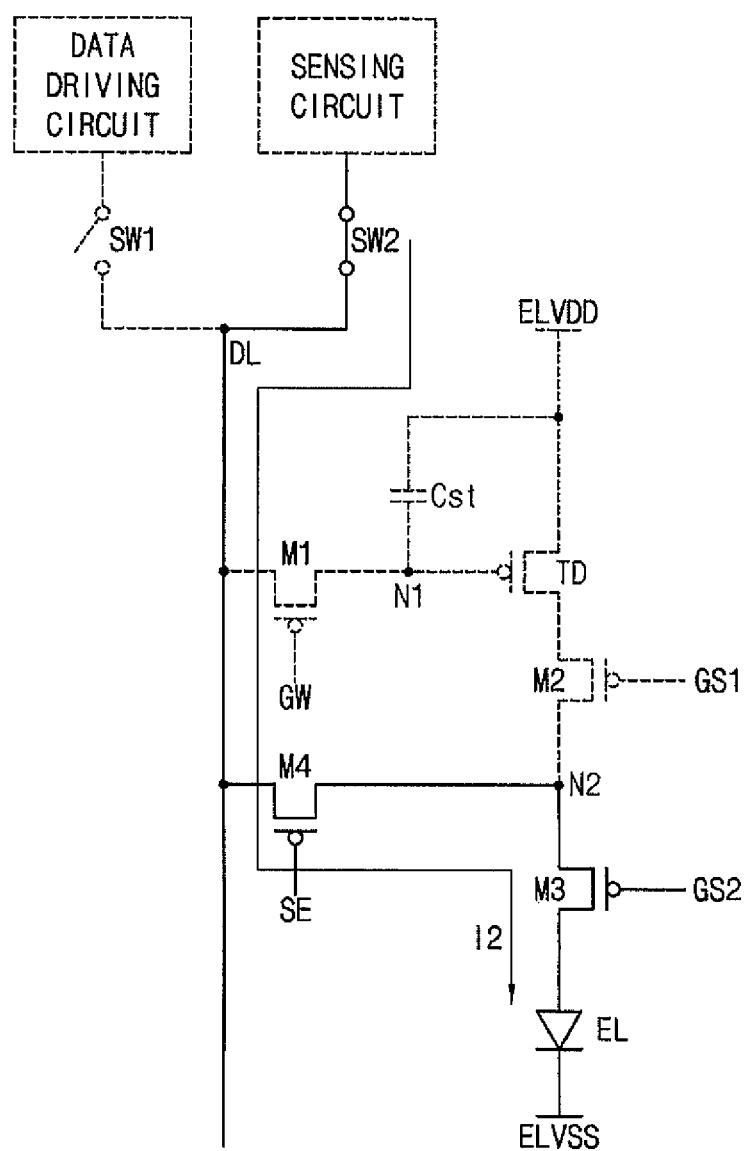
Figure 10:
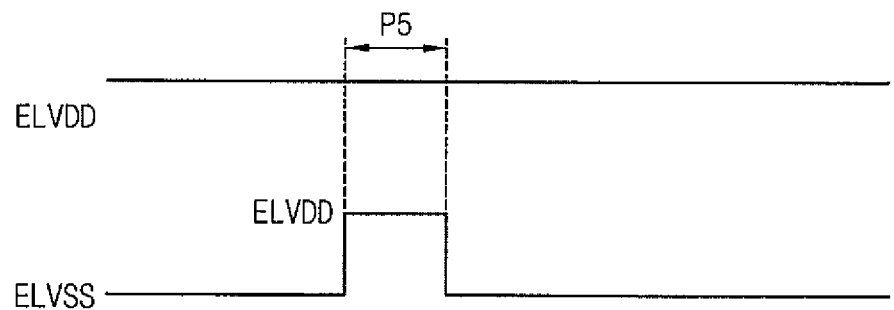
FIG. 10 is a timing diagram illustrating an example of power voltages provided to the pixel circuit according to the timing diagram of FIG. 8.

FIG. 8 is a timing diagram illustrating still another example of signals provided to the pixel circuit of FIG. 1. FIGS. 9A through 9C are diagrams illustrating an example of an operation of the pixel circuit based on the signals of FIG. 8. FIG. 10 is a timing diagram illustrating an example of power voltages provided to the pixel circuit of FIG. 8.

Referring to FIGS. 1 and 8 through 10, the pixel circuit 10 may output a second sensing current I2 to an external sensing circuit in a second sensing period SP2.

In some embodiments, the second sensing period SP2 may be included in at least a part of a vertical blank period VB between a previous frame and a present frame. The second sensing period SP2 may include a data writing period P4 and a second current sensing period P6. The second sensing period SP2 may further include a voltage adjusting period P5 between the data writing period P4 and the second current sensing period P6 to adjust a second power voltage ELVSS.

The second control signal GS2 may have a logical low level L during the second sensing period SP2 to turn on the second control switch M3 such that degradation of the organic light emitting diode EL is detected. Thus, the second control switch M3 may maintain a turn on state during the second sensing period SP2.

The scan signal GW and the first control signal GS1 may have the logical low level L during the data writing period P4. Thus, as illustrated in FIG. 9A, the scan switch M1 may be turned on such that the reference voltage Vref may be applied to the first node N1. Thus, a voltage difference between the first power voltage ELVDD and the reference voltage Vref may be charged to the storage capacitor Cst.

The scan signal GW, the sensing control signal SE, and the first control signal GS1 may have the logical high level H during the voltage adjusting period P5. As illustrated in FIG. 9B, only the second control switch M3 may maintain the turn on state in the voltage adjusting period P5. In some embodiments, the second power voltage ELVSS may be adjusted in the voltage adjusting period P5 to prevent or reduce current leakage to the organic light emitting diode EL. For example, as illustrated in FIG. 10, the second power voltage ELVSS may be adjusted to be substantially the same as the first power voltage ELVDD during the voltage adjusting period P5. However, this is an example and a voltage level of the second power voltage ELVSS in the voltage adjusting period P5 is not limited thereto. For example, the first power voltage ELVDD and/or the second power voltage ELVSS may be adjusted. In some embodiments, the voltage adjusting period P5 may be omitted and the second sensing current I2 may be provided to the sensing circuit right after the data writing period P4.

The sensing control signal SE may have the logical low level L during the second current sensing period P6. The first control signal GS1 may have the logical high level H during the second current sensing period P6. Thus, as illustrated in FIG. 9C, the sensing switch M4 may be turned on. The second sensing current I2 flowing through the organic light emitting diode EL may be output to the sensing circuit through the data line DL by the sensing switch M4 in the second current sensing period P6. The sensing circuit may read the second sensing current I2. Accordingly, a degree of degradation of the organic light emitting diode EL may be detected.

The first control signal GS1, the second control signal GS2, and the sensing control signal SE may have the logical high level H in a next frame (i.e., a Kth FRAME). The scan signal GW may have the logical low level L in the next frame such that a data voltage corresponding to an image may be applied to the pixel circuit 10 through the scan switch M1.

As described above, degradation of the organic light emitting diode EL may be detected and compensated in real time while displaying images by controlling the first control switch M2, the second control switch M3, and the sensing control switch M4.

Figure 11:
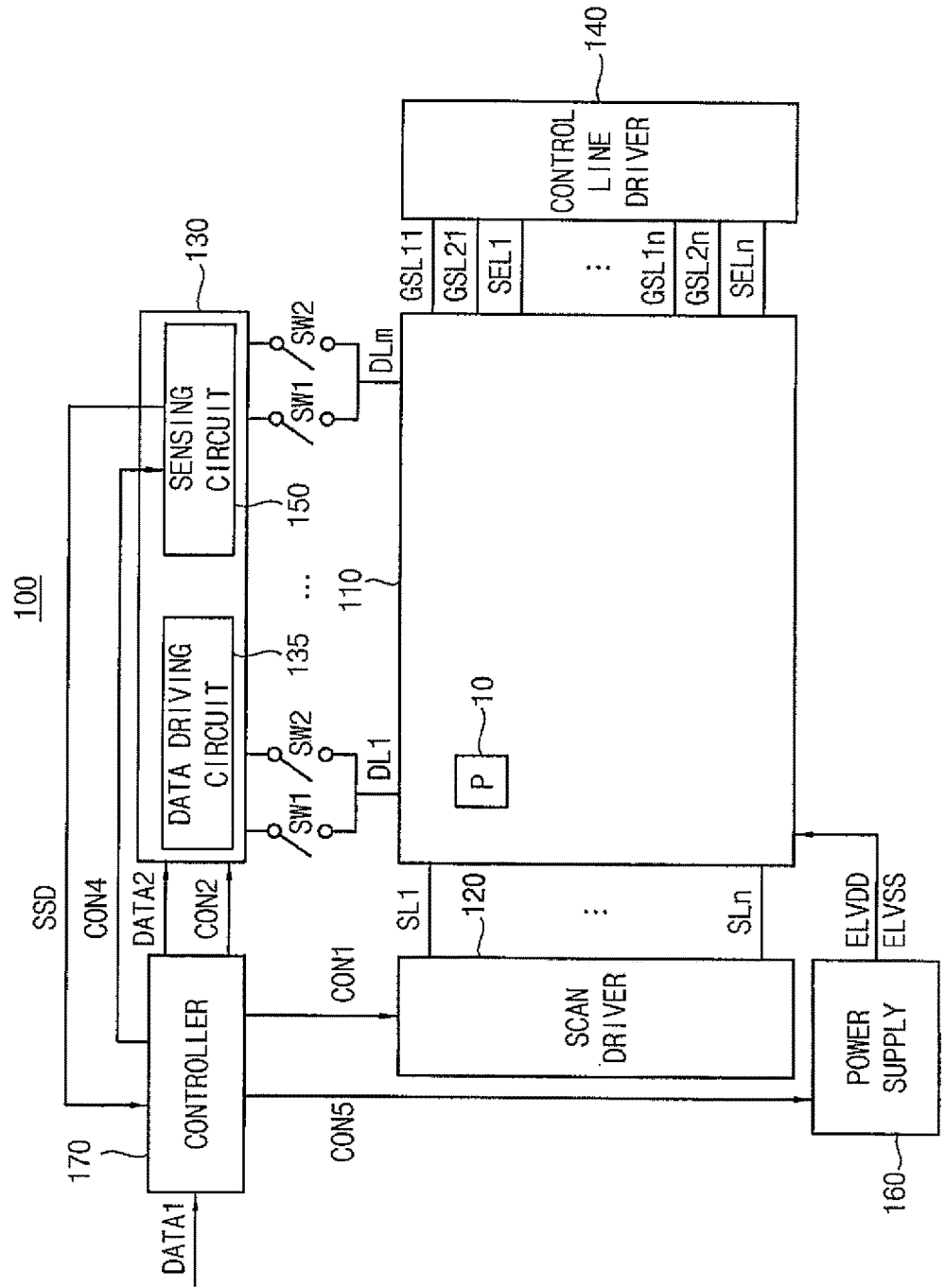
FIG. 11 is a block diagram of an organic light emitting display device according to example embodiments.

FIG. 11 is a block diagram of an organic light emitting display device according to example embodiments.

Referring to FIG. 11, the organic light emitting display device 100 may include a display panel 110, a scan driver 120, a data driver 130, a control line driver 140, a sensing circuit 150, a power supply 160, and a controller 170. In some embodiments, the sensing circuit may be physically included in the data driver 130 or the controller 170.

The display panel 110 may include a plurality of pixel circuits 10 connected to a plurality of scan lines SL1 to SLn, a plurality of data lines DL1 to DLm, a plurality of first control lines GSL11 to GSL1n, a plurality of second control lines GSL21 to GSL2n, and a plurality of sensing control lines SEL1 to SELn, respectively, where n and m are integers greater than 1.

Each of the pixel circuits 10 may receive a data signal in response to a scan signal GW and emit light based on the data signal. Each of the pixel circuits 10 may operate in an image display period and a sensing period. The sensing period may include a first sensing period SP1 for detecting (or sensing) a first sensing current I1 from the driving transistor TD and a second sensing period SP2 for detecting (or sensing) a second sensing current I2 from the organic light emitting diode EL. Each of the pixel circuits 10 may include an organic light emitting diode EL connected between a second node N2 and a second power voltage ELVSS, a scan switch M1 connected between a data line and a first node N1 and configured to transmit a reference voltage corresponding to a gray level (e.g., a predetermined gray level) to the first node N1 based on a scan signal GW, a storage capacitor Cst connected between the first node N1 and a first power voltage ELVDD greater than the second power voltage ELVSS, a driving transistor TD connected to the first power voltage ELVDD and configured to generate a driving current corresponding to a charged voltage at the storage capacitor Cst, a first control switch M2 connected between the driving transistor TD and the second node N2 and configured to be turned on during the first sensing period SP1 based on a first control signal GS1, a second control switch M3 connected between the second node N2 and an anode of the organic light emitting diode EL and configured to be turned on during the second sensing period SP2 based on a second control signal GS2, and a sensing switch M4 connected between the data line and the second node N2 and configured to be turned on based on a sensing control signal SE. Because constructions and operations of the pixel circuits 10 are descried above referred to FIGS. 1 to 10, duplicated descriptions may be omitted.

The scan driver 120 may sequentially provide the scan signals GW to the scan lines SL1 to SLn based on a scan control signal CON1.

The data driver 130 may generate the data signals and the reference voltage based on image data DATA2. The data driver 130 may generate the data signals corresponding to an image based on a data driving control signal CON2 in the image display period. The data signals may be provided to the data lines DL1 to DLm. The data driver 130 may generate the reference voltage corresponding to a gray level (e.g., a predetermined gray level) based on the data driving control signal CON2 in the first and second sensing periods SP1 and SP2. The reference voltages may be provided to the data lines DL1 to DLm. In some embodiments, the image data DATA2 may be compensated image data to which input image data DATA1 is compensated based on sensing data SSD. A compensated value may be applied to the data signal and the reference voltage. The sensing data SSD may be generated in the sensing circuit 150 based on the first sensing current I1 and the second sensing current I2.

In some embodiments, the data driver 130 may include a data driving circuit 135 for generating the data signal and the reference voltage and the sensing circuit 150 generating the sensing data SSD based on the sensing currents. In some embodiments, each of the data lines DL1 to DLm may include a first switch SW1 connected to the data driving circuit 135 and a second switch SW2 connected to the sensing circuit 150. When the data signal or the reference voltage is applied to the display panel 110, the first switch SW1 may be turned on and the second switch SW2 may be turned off. For example, the first switch SW1 may be turned on and the second switch SW2 may be turned off in a data writing period of the first and second sensing periods SP1 and SP2. When the first sensing current I1 or the second sensing current I2 is provided to the sensing circuit 150, the first switch SW1 may be turned off and the second switch SW2 may be turned on. Thus, additional feedback lines for sensing pixel currents are not used.

The control line driver 140 may generate the first control signal GS1, the second control signal GS2, and the sensing control signal SE based on a control line driving control signal CON3. The control line driver 140 may provide the first control signal GS1 to the first control lines GSL11 to GSL1n, provide the second control signal GS2 to the second control lines GSL21 to GSL2n, and provide the sensing control signal SE to the sensing control lines SEL1 to SELn. The first sensing current I1 may be detected in the first sensing period SP1 based on the first control signal GS1, the second control signal GS2, and the sensing control signal SE. The second sensing current I2 may be detected in the second sensing period SP2 based on the first control signal GS1, the second control signal GS2, and the sensing control signal SE. In some embodiments, the first sensing period SP1 is at least a part of a first vertical blank period and the second sensing period SP2 may be included in at least a part of a second vertical blank period.

The sensing circuit 150 may read the first sensing current I1 and the second sensing current I2 based on a sensing circuit control signal CON4 and generate the sensing data SSD based on the first sensing current I1 and the second sensing current I2. In some embodiments, the sensing data SSD may include information of degrees of degradation of the organic light emitting diode EL, variations of threshold voltage/mobility of the driving transistor TD, and so on. The sensing data SSD may be provided to the controller 170. In some embodiments, the sensing circuit 150 may be included in the data driver 130 or the controller 170.

The power supply 160 may generate the first power voltage ELVDD and the second power voltage ELVSS to drive the organic light emitting display device 100. The power supply 160 may provide the first power voltage ELVDD and the second power voltage ELVSS to the display panel 110. The first power voltage ELVDD may be greater than the second power voltage ELVSS.

The controller 170 may control the scan driver 120, the data driver 130, the control line driver 140, the sensing circuit 150, and the power supply 160 based on the input image data DATA1. The controller 170 may generate the scan control signal CON1 for controlling the scan driver 120, the data driving control signal CON2 for controlling the data driver 130, the control line control signal CON3 for controlling the control line driver 140, and the sensing circuit control signal CON4 for controlling the sensing circuit 150. The controller 170 may further generate a control signal CON5 for controlling the power supply 160.

The controller 170 may generate the compensated image data DATA2 based on the input image data DATA1 and the sensing data SSD. The compensated image data DATA2 may be provided to the data driver 130. The compensated image data DATA2 may compensate the degradation of the organic light emitting diode EL and variation of the threshold voltage/mobility of the driving transistor TD.

As described above, the organic light emitting display device may include pixels that operate in the first and second sensing periods SP1 and SP2 between image display periods such that the organic light emitting display device may read the pixel currents in real time. Thus, the degradation of the organic light emitting diode EL and variation of the threshold voltage/mobility of the driving transistor TD may be detected and compensated in real time while displaying images. Therefore, a sensing time for compensating the image data may be reduced and display quality may be maintained by sensing and compensating.

The present embodiments may be applied to any display device and any system including the display device performing the pixel current sensing operations. For example, the present embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and features of example embodiments. Accordingly, all such modifications are intended to be included within the scope of example embodiments as defined in the claims and their equivalents. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other suitable example embodiments, are intended to be included within the scope of the appended claims and their equivalents. The inventive concept is defined by the following claims, with equivalents of the claims to be included therein.

What is claimed is:

1. A pixel circuit comprising:
a scan switch connected between a data line and a first node and configured to transmit a reference voltage, received from a data driving circuit via a first external switch, to the first node based on a scan signal, the reference voltage corresponding to a gray level;
a storage capacitor connected between the first node and a first power voltage;
an organic light emitting diode connected between a second node and a second power voltage, the first power voltage being greater than the second power voltage;
a driving transistor connected to the first power voltage and configured to generate a driving current corresponding to a charged voltage at the storage capacitor;
a first control switch connected between the driving transistor and the second node and configured to be turned on during a first sensing period based on a first control signal;
a second control switch connected between the second node and an anode of the organic light emitting diode and configured to be turned on during a second sensing period based on a second control signal; and
a sensing switch connected between the data line and the second node and configured to be turned on based on a sensing control signal,
wherein the data line is configured to provide a sensing current to an external sensing circuit via a second external switch in the first sensing period to detect characteristics of the driving transistor,
wherein the first sensing period comprises:
a data writing period;
a voltage adjusting period; and
a first current sensing period,
wherein the voltage adjusting period between the data writing period and the first current sensing period,
wherein the first control signal has a logical low level during the first sensing period to turn on the first control switch such that characteristics of the driving transistor are detected,
wherein the second control signal has the logical low level to turn on the second control switch during the data writing period such that the organic light emitting diode emits light,
wherein the scan signal has the logical low level to turn on the scan switch during the data writing period such that the reference voltage is applied to the first node,
wherein the first power voltage is substantially the same as the second power voltage during the voltage adjusting period,
wherein the scan signal, the sensing control signal, and the second control signal have a logical high level during the voltage adjusting period, and
wherein the sensing control signal has the logical low level to turn on the sensing switch and the second control signal has a logical high level to turn off the second control switch during the first current sensing period such that the sensing current corresponding to the driving current does not flow into the organic light emitting diode.

2. The pixel circuit of claim 1,
wherein the first sensing period is at least a part of a vertical blank period between a previous frame and a present frame.

3. The pixel circuit of claim 1,
wherein the second sensing period is at least a part of a vertical blank period between a previous frame and a present frame.

4. The pixel circuit of claim 1, wherein the second sensing period comprises:
a data writing period; and
a second current sensing period.

5. The pixel circuit of claim 4,
wherein the second control signal has a logical low level during the second sensing period to turn on the second control switch.

6. The pixel circuit of claim 5,
wherein the scan signal and the first control signal have the logical low level during the data writing period to turn on the scan switch and the first control switch such that the driving current flows into the organic light emitting diode.

7. The pixel circuit of claim 6,
wherein the sensing control signal has the logical low level to turn on the sensing switch and the first control signal has a logical high level to turn off the first control switch during the second current sensing period such that the sensing current corresponding to the driving current is provided to the external sensing circuit through the data line during the second current sensing period to detect characteristics of the organic light emitting diode.

8. The pixel circuit of claim 7, further comprising:
a power supply configured to adjust the first power voltage to be substantially the same as the second power voltage during a voltage adjusting period,
wherein the second sensing period further comprises the voltage adjusting period between the data writing period and the second current sensing period,
wherein the scan signal, the sensing control signal, and the first control signal have the logical high level during the voltage adjusting period.

9. An organic light emitting display device comprising:
a display panel comprising a plurality of pixels each connected to a respective scan line of a plurality of scan lines, a respective data line of a plurality of data lines, a respective first control line of a plurality of first control lines, a respective second control line of a plurality of second control lines, and a respective sensing control line of a plurality of sensing control lines;
a scan driver configured to provide scan signals to the scan lines;
a data driver configured to provide data signals corresponding to an image to the data lines in an image display period and to provide reference voltages corresponding to gray levels to the data lines in a first sensing period and a second sensing period, the data driver being coupled to the data lines via a first switch;

a control line driver configured to provide first control signals, second control signals, and sensing control signals to the first control lines, the second control lines, and the sensing control lines, respectively;

a sensing circuit configured to read first sensing currents and second sensing currents and to generate sensing data based on the first sensing currents and the second sensing currents, the sensing circuit being coupled to the data lines via a second switch;

a power supply configured to provide a first power voltage and a second power voltage less than the first power voltage to the display panel; and a controller configured to generate compensated image data based on the sensing data, wherein each of the pixels comprises:
- a scan switch connected between the respective data line and a first node and configured to transmit a respective reference voltage of the reference voltages to the first node based on a respective scan signal of the scan signals;
- an organic light emitting diode connected between a second node and the second power voltage;
- a storage capacitor connected between the first node and the first power voltage;
- a driving transistor connected to the first power voltage and configured to generate a driving current corresponding to a charged voltage at the storage capacitor;
- a first control switch connected between the driving transistor and the second node and configured to be turned on during the first sensing period based on a respective first control signal of the first control signals;
- a second control switch connected between the second node and an anode of the organic light emitting diode and configured to be turned on during the second sensing period based on a respective second control signal of the second control signals; and
- a sensing switch connected between the data line and the second node and configured to be turned on based on a respective sensing control signal of the sensing control signals.

10. The display device of claim 9, wherein the first sensing period is at least a part of a first vertical blank period and the second sensing period is at least a part of a second vertical blank period.

11. The display device of claim 9, wherein the sensing circuit is configured to read the first sensing currents, which flow through the driving transistors, from the data lines during the first sensing period, and wherein the sensing circuit is configured to read the second sensing currents, which flow into the organic light emitting diodes, from the data lines during the second sensing period.

12. The display device of claim 9, wherein the data driver is configured to generate the data signals and the reference voltages based on the compensated image data.

* * * * *